United States Patent [19]
Yang

[11] Patent Number: 6,155,537
[45] Date of Patent: Dec. 5, 2000

[54] DEEP SUBMICRON MOS TRANSISTORS WITH A SELF-ALIGNED GATE ELECTRODE

[75] Inventor: Yu-Hao Yang, Hsinchu, Taiwan

[73] Assignee: Windbond Electronics Corp., Hsinchu, Taiwan

[21] Appl. No.: 09/113,037

[22] Filed: Jul. 9, 1998

[51] Int. Cl.[7] .................................................. H01L 29/76
[52] U.S. Cl. ........................ 254/314; 257/314; 257/315; 257/316; 257/344; 257/413; 257/414
[58] Field of Search .................................. 257/314, 315, 257/316, 413, 414, 344

[56] References Cited

U.S. PATENT DOCUMENTS

| | | | |
|---|---|---|---|
| 5,654,568 | 8/1997 | Nakao ...................................... | 257/324 |
| 5,675,161 | 10/1997 | Thomas ................................... | 257/316 |
| 5,736,765 | 4/1998 | Oh et al. ................................. | 257/321 |
| 5,932,909 | 8/1999 | Kato et al. ............................... | 357/316 |
| 5,939,749 | 8/1999 | Taketa et al. ............................ | 257/316 |

FOREIGN PATENT DOCUMENTS

| | | | |
|---|---|---|---|
| 404076955 | 3/1992 | Japan .................................... | 257/315 |

*Primary Examiner*—David Hardy
*Assistant Examiner*—Edgardo Ortiz
*Attorney, Agent, or Firm*—W. Wayne Liauh

[57] ABSTRACT

A MOS transistor with a pair of lightly doped drain (LDD) sub-regions in the substrate and whose gate electrode is self-aligned with a non-doped gate oxide layer overlying the channel region between the two LDD sub-regions. The MOS transistor is characterized as having the following structure: (a) a substrate having a source region and a drain region; (b) a gate oxide layer on the substrate which overlays the source and drain regions, the gate oxide layer containing a central portion and two side portions, the central portion being a non-doped, and the side portions being lightly doped with a dopant; (c) a gate electrode formed on the gate oxide layer, the gate electrode having a base self-aligned with the central non-doped portion of the gate oxide layer; (d) a pair of sidewall spacers formed on sidewalls of the gate electrode, each of the sidewall spacers having a base self-aligned with a respective lightly doped side portion of the gate oxide layer; and (e) a pair of non-contiguous lightly dopes drain (LDD) sub-regions formed in the substrate. The LDD sub-regions respectively underlie the lightly doped side portions of the gate oxide layer and are formed by thermal diffusion of dopants therefrom, the LDD sub-regions are also respectively adjacent to the source and drain regions and are facing each other to define a channel region therebetween.

12 Claims, 3 Drawing Sheets

DEEP SUBMICRON MOS TRANSISTORS WITH A SELF-ALIGNED GATE ELECTRODE

FIELD OF THE INVENTION

The present invention relates to a method for fabricating deep submicron MOS transistors with a raised gate structure stacked on a pair of dielectric spacers and the MOS transistors fabricated therefrom. More specifically, the present invention relates to an improved method for fabricating deep submicron (typically less than 0.40 $\mu$m) MOS transistors which relaxes the dimensional precision requirement of the photolithography technique during the fine gate patterning steps, and the MOS transistors fabricated therefrom. In other words, the method of the present invention allows the conventional photolithography technique to be used for fabricating deep submicron MOS transistors with commercially satisfactory yield rate and excellent final products. The method disclosed in the present invention is most advantageous in making transistors having lightly doped drain (LDD) regions.

BACKGROUND OF THE INVENTION

In the semiconductor industry, the IC manufacturers are facing enormous pressure to constantly develop improved technologies that will allow the electronic circuitry in the ICs to become ever smaller. For transistors having dimensions of less than 0.4 micron (which is typically called as the submicron region), the resolution limits of conventional photolithography technology are approached. As a result, it becomes difficult to control the yield rate.

FIGS. 1A through 1C schematically show the main steps of the conventional approach in fabricating MOS (Metal-Oxide-Semiconductor) gate having a pair of sidewall spacers on two opposing sides of the gate. FIG. 1A shows that a polysilicon layer 1 is deposited on a substrate 2 with a thin oxide layer 3 separating the polysilicon layer and the substrate. A positive resist 4 is formed on the polysilicon layer using fine line patterning. After etching, a gate electrode 5 is formed.

In order to eliminate a hot carrier effect, a lightly doped drain (LDD) structure 6, which contains two LDD subregions, is often formed, via impurity implantation, in the substrate using the gate electrode 5 as a mask. Then, a pair of sidewall spacers 7 are formed on the two opposing sides of the gate 5. Finally, heavily doped regions are formed via heavy impurity implantation using the gate electrode 5 and the sidewall spacers as mask, to form drain 8 and source 9, respectively.

In the conventional process as described above, the step of fine line patterning of the photoresist layer is a critical step in defining the gate and the channel dimension of the MOS. The variation of the dimension of the gate and thus the dimension of the channel of the MOS is dictated by the variation of the photolithography technique. As the dimension of MOS approaches the deep submicron region (typically less than 0.4 microns), the device performance becomes marginal (i.e., a small error can cause the device to fail), and a tighter control in the critical dimension (CD) of the gate pattern becomes essential. This has led to the development of more precise photoresist systems such as the inclusion of an anti-reflection layer, DUV lithography systems, etc. However, these techniques are still in the experimental stage, and there are concerns as to whether they possess the requisite stability. Furthermore, even these techniques should eventually become successful, they may not be cost-effective.

U.S. Pat. No. 5,270,234 discloses a method for fabricating deep submicron transistors which employs only optical lithography and involves the formation of a relative wide aperture using optical techniques. In the process disclosed in the '234 patent, an aperture is formed in a polished layer having a dimension that is considerably larger than the final channel width and within the limits of the lithography. Sidewalls are formed within the aperture in a controllable manner to determine the final channel width of the transistor. The thickness of the sidewalls is maintained during the fabrication process by the use of a two-component sidewall and a selective etch, so that the etching process that determines the final channel dimension does not change the sidewall thickness. The process disclosed in the '234 may have some technical but it is relatively complicated and may not be cost effective.

U.S. Pat. No. 5,374,575 discloses a method for fabricating LDD MOS transistors having a lightly doped drain structure capable of simplifying the fabrication and improving characteristics of the transistor. In a highly integrated system, such as the submicron system, a high electric field may occur at edge portions of the gate electrode causing the generation of hot carriers. The hot carriers serve to degrade the operation characteristic of MOS transistors and reduce the life thereof. The '375 illustrates the importance of having a well defined dimension for the gate electrode; however, it does not teach or suggest method which will allow MOS manufacturers to relax the dimensional precision requirement of lithophotography technique when fabricating submicron MOS transistors.

U.S. Pat. No. 5,538,913 discloses a process for fabricating submicron MOS transistor devices with a full-overlap lightly-doped drain. With the process disclosed in the '913 patent, the gate electrode comprises a conducting layer and a pair of conducting sidewall spacers, and a p-type diffusion region is formed by ion implantation between and below the pair of conducting sidewall spacers to prevent punch-through of the channel region. The MOS transistor fabricated from the '913 has a gate electrode of uniform width.

At the present time, it appears that there is no available method that will satisfactorily relax the dimensional precision requirement of the photolithography technique for fabricating deep submicron MOS transistors. It is highly preferred that any method that can be developed will be able to utilize currently existing technology so as to allow IC manufacturers to defer the need for expensing new capitals, while significantly improving the process yield in fabricating deep submicron MOS transistors.

SUMMARY OF THE INVENTION

The primary object of the present invention is to develop an improved method for fabricating deep submicron (typically less than 0.40 $\mu$m) MOS transistors which relaxes the dimensional precision requirement of the photolithography technique during the fine gate patterning. More specifically, the primary object of the present invention is to develop a method by which the conventional photolithography techniques can be used for fabricating deep submicron MOS transistors so that IC manufacturers can delay the need for large capital investment while allowing the yield rate of the submicron MOS transistors to maintain at a satisfactorily high level.

One of the main characteristics of the MOS transistor fabricated from the process of the present invention is that its gate electrode has a novel "outwardly diverging" configuration which is integrally stacked on a pair of opposing dielectric sidewall spacers. The implementation of the pair of opposing dielectric sidewall spacers, which also collectively form a mirror-imaged outwardly diverging configuration, allows deep submicron gates to be formed using conventional photolithography technique.

The process disclosed in the present invention contains the following steps:

(a) Preparing a semiconductor substrate having a pad oxide layer thereon.

(b) Depositing a first dielectric layer, such as oxide, polysilicon, or silicon nitride, on the pad oxide layer. The first dielectric layer can have a thickness ranging from 10 nm to 1 $\mu$m. A photomask region is defined using conventional photolithography technique. The dielectric layer is then etched to reveal a channel region which lies below the etched region, or the trench region. The width of the trench region can be from 1 nm to 5 $\mu$m and is formed wider than the width of the MOS channel to be ultimately formed.

(c) Depositing a silicate-glass oxide layer on the first dielectric layer. The thickness of the silicate-glass oxide layer ranges from 1 nm to 1 $\mu$m. The silicate-glass oxide layer is lightly doped with arsenic, phosphorus, or boron material. In a preferred embodiment of the present invention, arsenic silicate-glass (ASG) is used. The ASG layer is used to form the LDD region after subsequent thermal treatment.

(d) Depositing a second dielectric layer such as oxide or nitride on top of the ASG layer, the thickness of the second dielectric layer ranges from 10 nm to 1 $\mu$m.

(e) Using an anisotropic etching technique to etch the second dielectric layer and form a pair of sidewall spacers. The distance between the two sidewall spacers defines the dimension of the MOS channel region.

(f) Removing the ASG layer on top of the channel region and then growing a gate oxide layer on top of the channel region by conventional furnace oxidation or rapid-thermal oxidation, wherein the dopant arsenic is out-diffused into the substrate to form LDD region during gate oxidation.

(g) Filling the gate region (i.e., between the sidewall spacers) with polysilicon having a thickness from 1 nm to 5 $\mu$m; the polysilicon inside the gate region will eventually form the gate electrode.

(h) Using a chemical-mechnical polishing or anisotropic dry etch technique to remove the polysilicon on top of the first dielectric layer and an outwardly diverging polysilicon gate integrally stacked on the pair of dielectric sidewall spacers is formed.

Finally, the first dielectric layer and the ASG layer are selectively removed leaving the gate area on the silicon surface. A final oxide layer is then deposited or grown to cap the gate area and a conventional ion implantation technique is applied, using the final oxide layer as a mask, to form source and drain regions, respectively. Thus, an improved MOS device having a narrow channel and an outwardly expanding gate electrode integrally stacked on a pair of sidewall spacers is formed using the conventional photolithography technique.

BRIEF DESCRIPTION OF THE DRAWING

The present invention will be described in detail with reference to the drawing showing the preferred embodiment of the present invention, wherein:

FIG. 2A shows that a first dielectric layer having a trench region wider than the width of the active channel is deposited on a substrate.

FIG. 2B shows that a silicate-glass oxide layer is deposited on the first dielectric layer, followed by the deposition of a second dielectric layer on top of the ASG layer.

FIG. 2C shows that the second dielectric layer is etched using an anisotropic etching technique form a pair of sidewall spacers; the distance between the two sidewall spacers at the bottom portions respectively thereof defines the dimension of the MOS channel region. FIG. 2C also shows that a ASG layer on top of the channel region is removed and gate oxide layer is grown in its place, and that the dopant in the ASG layer is out-diffused into the substrate to form LDD region during the formation of the gate oxide layer.

FIG. 2D shows that the gate electrode is formed by filling the gate region with polysilicon, followed by removing the polysilicon on top of the first dielectric layer so as to form an outwardly diverging polysilicon gate which is integrally stacked on the pair of dielectric sidewall spacers.

FIG. 3 also shows that an oxide layer is deposited or grown to cap the gate area and that a conventional ion implantation technique is applied to form source and drain regions, respectively.

DETAILED DESCRIPTION OF THE PREFERRED EMBODIMENT

The present invention discloses an improved method for fabricating deep submicron (typically less than 0.40 $\mu$m) MOS transistors which relaxes the dimensional precision requirement 0 of the photolithography technique during the fine gate patterning step. With the method disclosed in the present invention, conventional photolithography techniques can be used for fabricating deep submicron MOS transistors with high success rate. This thus enables the IC manufacturers to delay large capital investment while allowing the yield of the submicron MOS transistors to maintain at a satisfactorily high level.

Figure 1A:
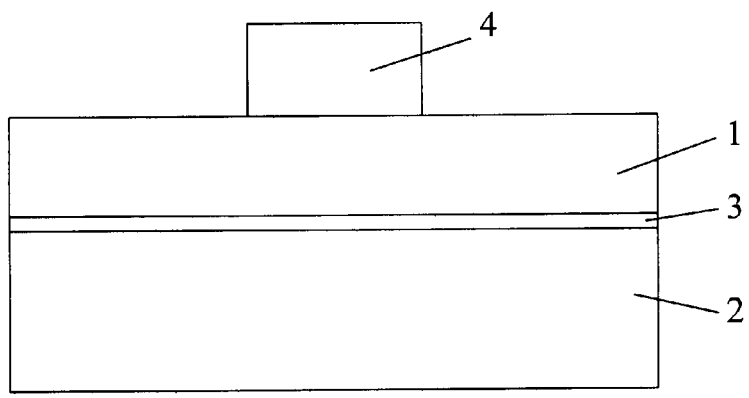
FIGS. 1A–1C are schematic drawings showing the steps of forming the MOS (metal-oxide semiconductor) transistor according to the conventional method.
Figure 1B:
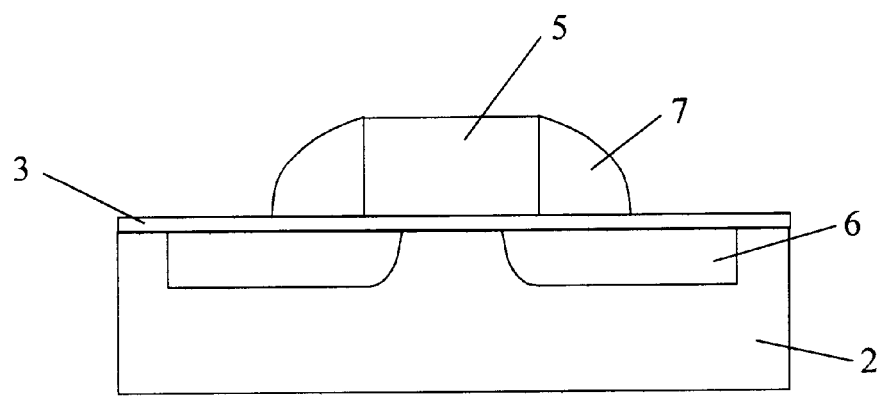
Figure 1C:
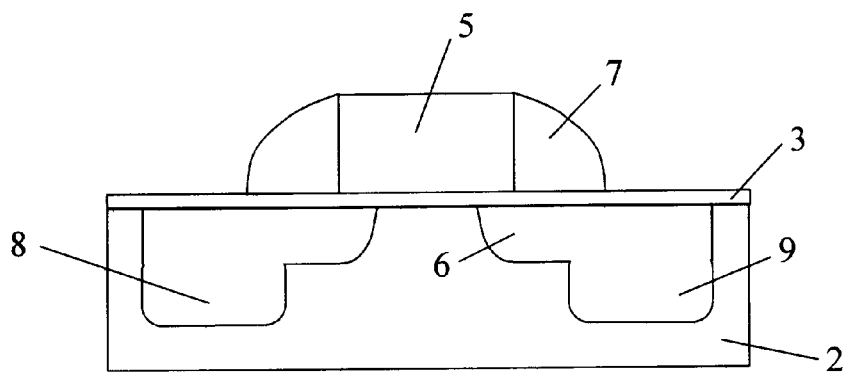

FIGS. 1A–1C are schematic drawings showing the steps of forming the MOS (metal-oxide semiconductor) transistor according to the conventional method. One of the key steps of the conventional method is to form a positive photoresist on the polysilicon layer using fine line patterning. After etching, a gate electrode is formed, as shown in FIG. 1A. The step of fine line patterning of the photoresist layer is a critical step in defining the gate and the channel dimensions of the MOS. The variation of the dimension of the gate and thus the dimension of the channel of the MOS is greatly influenced by the variation of the photolithography technique. As the dimension of MOS approaches the deep submicron (typically less than 0.4 microns), the device performance becomes marginal (i.e., a small error can cause the device to fail), and a tighter control in the critical dimension (CD) of the gate pattern becomes essential. This has led to the development of more precise photoresist systems such as the inclusion of an anti-reflection layer, DUV lithography systems, etc. Most of these techniques are still in the experimental stage; there are concerns as to whether they possess the requisite stability and whether they may be cost-effective.

In the process disclosed in the present invention the gate electrode has a novel outwardly diverging configuration which is integrally stacked on a pair of opposing dielectric sidewall spacers. The use of the pair of opposing dielectric sidewall spacers, which collectively form an outwardly diverging configuration, to define the gate electrode allows a very narrow gate, and a correspondingly narrow active MOS channel, to be formed using conventional photolithography technique.

In summary, the process disclosed in the present invention contains the following steps:

(a) Depositing a first dielectric layer, such as oxide, polysilicon, or silicon nitride, on a pad oxide layer, which had been formed on a substrate. The first dielectric layer can have a thickness raignign from 10 nm to 1 $\mu$m. A photomask region is defined using conventional photolithography techniques. The first dielectric layer is then etched to reveal a channel region beneath the etched region, or the trench region. The width of the trench region can be from 1 nm to 5 $\mu$m and is formed wider than the width of the active MOS channel to be ultimately formed.

(b) Depositing a silicate-glass oxide layer on the first dielectric layer. The thickness of the silicate-glass oxide layer can range from 1 nm to 1 $\mu$m. The silicate-glass oxide layer is lightly doped with a dopant which can be arsenic, phosphorus, or boron material. In a preferred embodiment of the present invention, arsenic silicate-glass (ASG) is used, thus the name "ASG layer" is used to describe the silicate-glass oxide layer in general. The ASG layer is used to form the LDD region after subsequent thermal treatment.

(c) Depositing a second dielectric layer which can be an oxide or nitride layer on top of the ASG layer, the thickness of the second dielectric layer can range from 10 nm to 1 $\mu$m.

(d) Using an anisotropic etching technique to etch the second dielectric layer and form a pair of sidewall spacers. The distance between the two sidewall spacers is chosen which would define the dimension of the MOS channel region.

(e) Removing the ASG layer on top of the channel region and then growing a gate oxide layer on top of the channel region by conventional furnace oxidation or rapid-thermal oxidation. During the gate oxidation procedure, the dopant arsenic is out-diffused into the substrate to form LDD regions.

(f) Filling the gate region (i.e., between the sidewall spacers) with polysilicon to a thickness from 1 nm to 5 $\mu$m; the polysilicon inside the gate region will eventually form the gate electrode.

(g) Using a chemical-mechanical polishing or anisotropic dry etch technique to remove the polysilicon on top of the first dielectric layer and an outwardly diverging polysilicon gate integrally stacked on the pair of dielectric sidewall spacers is formed.

The first dielectric layer and the ASG layer are then selectively removed leaving the gate area on the silicon surface. A final oxide layer is then deposited or grown to cap the gate area and a conventional ion implantation (heavily doped) technique is applied to form the source and drain regions, respectively, using the final oxide layer as a mask. Final, an improved MOS device having a narrow channel and an outwardly expanding gate electrode integrally stacked on a pair of matching sidewall spacers is formed using conventional photolithography technique.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 2A–2D are schematic drawings showing the various steps of forming the MOS transistor according to a preferred embodiment of the present invention.

Figure 2A:
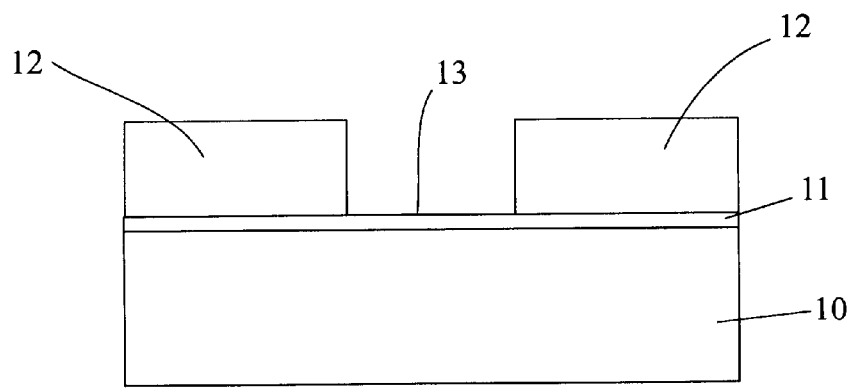
FIGS. 2A–2D are schematic drawings showing the various steps of forming the MOS transistor according to a preferred embodiment of the present invention.

FIG. 2A shows that a first dielectric layer 12 having a trench region 13 wider than the width of the active channel to be ultimately formed was deposited on a substrate 10. A pad oxide layer 11 had been formed separating the substrate 10 and the dielectric layer 12. The first dielectric layer 12 can have a thickness ranging from 10 nm to 1 $\mu$m. The first electric layer 12 was formed by first forming a photomask region, not shown, whose pattern was defined using conventional photolithography technique. The first dielectric layer was then etched using the photomask to reveal a channel region which lies below the etched region, or the trench region. The width of the trench region can be from 1 nm to 5 $\mu$m, and is formed wider than the width of the MOS channel to be ultimately formed.

Figure 2B:
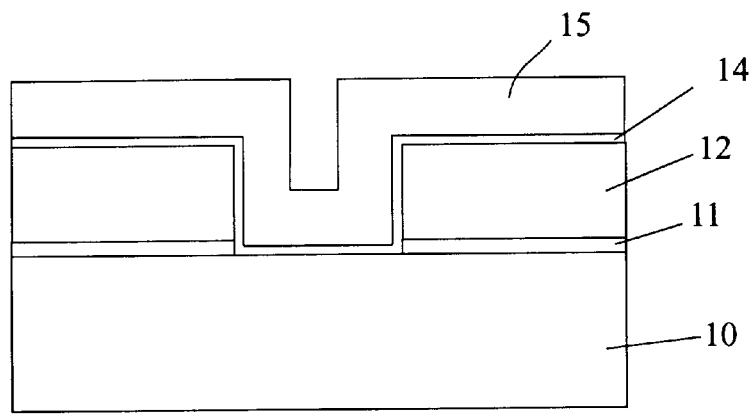

FIG. 2B shows that a silicate-glass oxide layer (or the ASG layer) 14 was deposited on the first dielectric layer 12, followed by the deposition of a second dielectric layer 15 on top of the silicate-glass oxide layer 14. The thickness of the silicate-glass oxide layer 14 can range from 1 nm to 1 $\mu$m, and the thickness of the second dielectric layer can range from 10 nm to 1 $\mu$m. The silicate-glass oxide layer was lightly doped with a dopant, which can be arsenic, phosphorus, or boron material. In a preferred embodiment of the present invention, arsenic silicate-glass (ASG) was used. The ASG layer would be used to form an LDD region after subsequent thermal treatment.

Figure 2C:
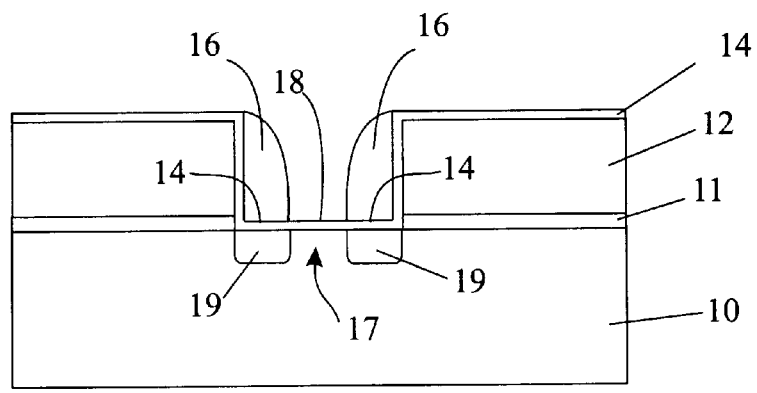

FIG. 2C shows that the second dielectric layer 15 was etched using an anisotropic etching technique form a pair of sidewall spacers 16. The distance between the two sidewall spacers 16 at the bottom portions respectively thereof defines the dimension of the MOS channel region 17. FIG. 2C also shows that the ASG layer on top of the channel region was removed and a gate oxide layer 18 was formed on top of the channel region by conventional furnace oxidation or rapid-thermal oxidation. During gate oxidation process, the dopant arsenic is out-diffused into the substrate to form LDD region 19. FIG. 2C also shows that the LDD sub-regions 19 are underlaying the doped side portions 14' of the overall gate oxide layer (14'=19).

Figure 2D:
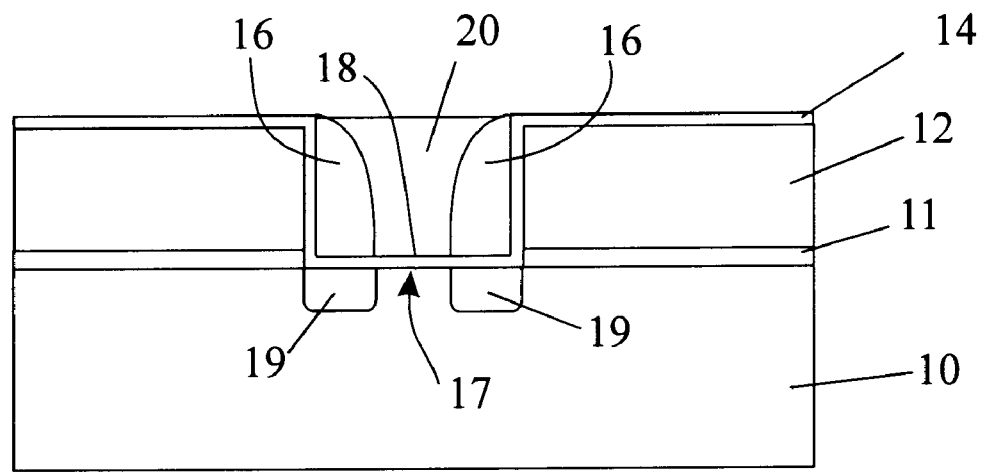

FIG. 2D shows the formation of the gate electrode 20 which was integrally stacked on the pair of sidewall spacers 16. This was accomplished by filling the gate region (i.e., between the sidewall spacers 16) with polysilicon to a thickness from 1 nm to 5 $\mu$m. Then the polysilicon layer on top of the first dielectric layer 11 was removed using a chemical-mechnical polishing or anisotropic dry etch technique. Because the gate electrode had been integrally stacked on the pair of sidewall spacers, an outwardly diverging polysilicon gate electrode was formed.

Figure 3:
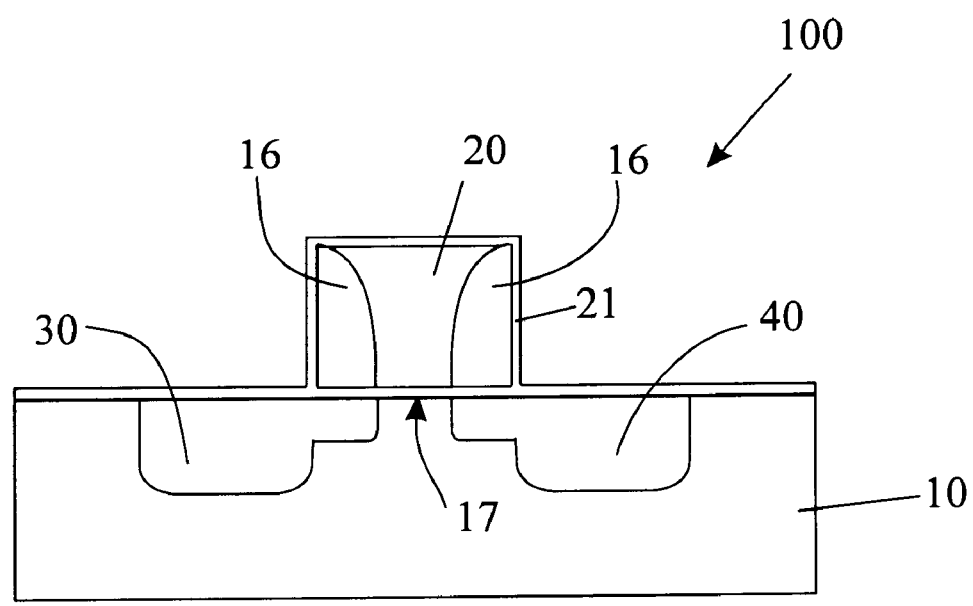
FIG. 3 is a schematic diagram showing that the ASG layer and the first dielectric layer are selectively removed leaving the gate area on the silicon surface.

FIG. 3 is a schematic diagram showing the final MOS transistor 100 prepared using the method disclosed in the present invention. After the electrode gate 20 was formed, the first dielectric layer and the ASG layer were selectively removed leaving the gate area, which includes the gate electrode 20 and the pair of dielectric sidewall spacers 16, on the silicon surface 10. A final oxide layer is then deposited or grown to cap the gate area and a conventional ion implantation (heavily doped) technique is applied to form the source 30 and drain 40 regions, respectively, using the final oxide layer as a mask. As shown in FIG. 3, the improved MOS device has a narrow channel region 17 and an outwardly expanding gate electrode 20 integrally stacked on a pair of matching sidewall spacers 16.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A MOS transistor comprising:

(a) a substrate having a source region and a drain region;

(b) a gate oxide layer on said substrate partially overlaying said source and drain regions said gate oxide layer containing a central portion and two side portions, said central portion being a non-doped, and said side portions being lightly doped with a dopant, (c) a gate electrode formed on said gate oxide layer, said gate electrode having a base self-aligned with said central non-doped portion of said gate oxide layer;

(d) a pair of sidewall spacers formed on sidewalls of said gate electrode, each of said sidewall spacers having a base generally self-aligned with a respective said lightly doped side portion of said gate oxide layer; and (e) a pair of non-contiguous lightly dopes drain (LDD) sub-regions formed in said substrate, wherein said LDD sub-regions respectively underlay said lightly doped side portions of said gate oxide layer and are formed by thermal diffusion of dopants therefrom, said LDD sub-regions are also respectively adjacent to said source and drain regions and are facing each other to define a channel region therebetween.

2. The MOS transistor according to claim 1 which is fabricated using a process comprising the steps of:

(a) forming a pad oxide layer on top of said substrate;

(b) forming a first dielectric layer having a trench region on said substrate;

(c) removing a portion said pad oxide layer in said trench region, and forming a silicate-glass oxide layer covering said first dielectric layer and said substrate in said trench region, wherein said silicate-glass oxide layer is doped with a dopant;

(d) forming a second dielectric layer covering said silicate-glass oxide layer;

(e) using an anisotropic etching technique to etch said second dielectric layer and form said pair of dielectric sidewall spacers, said dielectric sidewall spacers collectively define therebetween said channel region in said substrate and a gate region above said substrate, wherein said gate region is characterized in that its width generally increases with distance from said substrate;

(f) removing the portion of said silicate-glass oxide layer disposed between said pair of dielectric sidewall spacers, thus allowing lightly doped side portions of said gate oxide layer to remain;

(g) implementing a gate oxidation procedure which causes an oxide layer to be grown on top of said channel region between said doped side portions of said gate oxide layer to form said non-doped central portion of said gate oxide layer, and said dopant in said silicate-glass oxide layer to be out-diffused into the substrate to form said LDD sub-regions;

(h) depositing a polysilicon layer in said gate region, removing said polysilicon layer above said first dielectric layer to form said gate electrode, removing said first dielectric layer, capping said polysilicon layer in said gate region with a final oxide layer, and forming source and drain regions in said substrate using ion implantation.

3. The MOS transistor according to claim 2 wherein said first dielectric layer is forming using a photolithography technique in conjunction with a photoresist.

4. The MOS transistor according to claim 2 wherein said silicate-glass oxide layer is doped with a component selected from the group consisting of arsenic, phosphorus, and boron.

5. The MOS transistor according to claim 2 wherein said silicate-glass oxide layer is doped with arsenic.

6. The MOS transistor according to claim 2 wherein said first dielectric layer is an oxide layer, a polysilicon layer, or a silicon nitride layer.

7. The MOS transistor according to claim 2 wherein said second dielectric layer is an oxide layer or a nitride layer.

8. The MOS transistor according to claim 2 wherein said polysilicon layer above said first dielectric layer is removed using a chemical-mechanical polishing technique or an anisotropic dry etch technique.

9. The MOS transistor according to claim 2 wherein said trench region is formed which is wider than the design width of said channel region of said MOS transistor.

10. The MOS transistor according to claim 2 wherein said trench region has a width ranging from 1 nm and 5 $\mu$m.

11. The MOS transistor according to claim 2 wherein said dopant is selected from the group consisting of arsenic, phosphorus, and boron.

12. The MOS transistor according to claim 2 wherein said side portions of said gate oxide layer are glass oxide lightly doped with a dopant selected from the group consisting of arsenic, phosphorus, and boron.

* * * * *